United States Patent [19]
Dennison et al.

[11] Patent Number: 5,858,877
[45] Date of Patent: *Jan. 12, 1999

[54] SELF-ALIGNED PROCESS FOR MAKING CONTACTS TO SILICON SUBSTRATES DURING THE MANUFACTURE OF INTEGRATED CIRCUITS THEREIN

[75] Inventors: Charles H. Dennison, Meridian; Trung T. Doan, Boise, both of Id.

[73] Assignee: Micron Technology, Inc., Boise, Id.

[*] Notice: The term of this patent shall not extend beyond the expiration date of Pat. No. 5,651,855.

[21] Appl. No.: 786,482

[22] Filed: Jan. 21, 1997

Related U.S. Application Data

[63] Continuation of Ser. No. 626,651, Apr. 1, 1996, Pat. No. 5,651,855, and a continuation of Ser. No. 259,187, Jun. 13, 1994, abandoned, and a continuation-in-part of Ser. No. 921,320, Jul. 28, 1992, abandoned.

[51] Int. Cl.$^6$ ................................. H01L 21/306
[52] U.S. Cl. .................... 438/700; 438/620; 438/622; 438/634; 438/623; 438/624; 438/637; 438/666; 438/671; 438/740; 438/734; 438/736
[58] Field of Search .................... 437/195, 192; 438/622, 666, 669, 634, 623, 624, 637, 700, 618, 620, 671, 740, 734, 736

[56] References Cited

U.S. PATENT DOCUMENTS 5,126,006  6/1992  Cronin et al. .......................... 156/651
5,354,711  10/1994  Heitzmann et al. .................... 437/195

OTHER PUBLICATIONS

C.W. Kaanta et al., "Dual Damascene: A ULSI Wiring Technology" VMIC Conference, Jun. 11–12, 1991, pp. 144–152.

*Primary Examiner*—Charles L. Bowers, Jr.
*Assistant Examiner*—Lynne A. Gurley
*Attorney, Agent, or Firm*—Steven R. Ormiston

[57] ABSTRACT

A process for forming vertical contacts in the manufacture of integrated circuits, and devices so manufactured. The process eliminates the need for precise mask alignment and allows the etch of the contact hole to be controlled independent of the etch of the interconnect trough. The process includes the steps of: forming an insulating layer on the surface of a substrate; forming an etch stop layer on the surface of the insulating layer; forming an opening in the etch stop layer; etching to a first depth through the opening in the etch stop layer and into the insulating layer to form an interconnect trough; forming a photoresist mask on the surface of the etch stop layer and in the trough; and continuing to etch through the insulating layer until reaching the surface of the substrate to form a contact hole. The above process may be repeated one or more times during the formation of multi-level metal integrated circuits.

24 Claims, 5 Drawing Sheets

SELF-ALIGNED PROCESS FOR MAKING CONTACTS TO SILICON SUBSTRATES DURING THE MANUFACTURE OF INTEGRATED CIRCUITS THEREIN

CROSS-REFERENCE TO RELATED APPLICATION

This application is a continuation of application Ser. No. 08/626,651, filed Apr. 1, 1996 now U.S. Pat. No. 5,651,885, a continuation of application Ser. No. 08/259,187 filed on Jun. 13, 1994, now abandoned, a continuation-in-part of application Ser. No. 07/921,320 filed Jul. 28, 1992, now abandoned.

FIELD OF THE INVENTION

This invention relates generally to processes for manufacturing ultra large scale integrated circuits (ULSICs) and more particularly to a self-aligned process for simultaneously enhancing the achievable device packing density, device reliability and yields during such manufacture.

BACKGROUND OF THE INVENTION

In the manufacture of ultra large scale integrated circuits, such as 4 megabit and up dynamic random access memories (DRAMs), it has been one prior art approach to use an inlaid, fully integrated wiring technology which is known in the integrated circuit manufacturing arts as "Dual Damascene" technology. This approach to ULSI electrical contact development is described in some detail in Cronin, et al., U.S. Pat. No. 5,126,006 and in an article by Carter W. Kaanta, et al. entitled "Dual Damascene: A ULSI Wiring Technology," IBM General Technology Division, Essex Junction, Vt., *VMIC Conference*, Jun. 11–12, 1991, at pp. 144–152.

This Dual Damascene processing for etching troughs through insulating layers formed on silicon substrates utilizes, among other things, first and second successive etching steps in order to arrive at an ultimate trough and contact hole geometry within surrounding insulating layers formed on the surface of a silicon wafer. The first etch step forms the trough down to a controlled depth within the surface insulating layers. The second etch step extends the depth of the trough down to the active devices within the silicon substrate to form the contact hole. One disadvantage of using the above described Dual Damascene approach is that the photoresist etch mask required for the second etch step must be precisely aligned with respect to the trough opening formed by the first etch step. The requirement for precise alignment of the second etch mask imposes an upper threshold on the maximum achievable packing density, reliability and yields that can be reached using the above Dual Damascene process. In addition, present techniques do not allow the etch of the interconnect trough to be controlled independent of the etch of the stud or contact hole.

It is the solution to these problems to which the present invention is directed.

SUMMARY OF THE INVENTION

In accordance with the present invention, it has been discovered that the above problem of precise second etch mask alignment with respect to the first formed trough opening can be significantly reduced by the employment of an etch stop layer on the surface of the insulating layer. The width dimension of an opening in the etch stop layer is made coextensive with the width dimension of the desired trough opening to be formed within the insulating layer. Then, the etch stop layer is used in combination with an etchant to define the trough opening within the insulating layer. Next, a photoresist etch mask is formed on the surface of the etch stop layer and has an opening therein defined by predetermined width and length dimensions dependent upon the desired trough geometry. However, since the photoresist mask is formed above the etch stop layer, the alignment of its width dimension is not now critical inasmuch as the etching action for increasing the depth of a portion of the trough to complete formation of the stud or contact hole is confined, or self-aligned, by the opening in the etch stop layer. Thus, as this second etching step of the insulating layer continues on to the silicon substrate surface, its width dimension remains constant. Also, because the interconnect trough is completely formed in the first etch, the trough can be and is masked during the second etch that forms the stud or contact hole. The etch that forms the contact hole can, therefore, be controlled independent of the etch that forms the trough.

Next, the photoresist mask is removed and the completed trough and contact hole is filled with a selected metal such as tungsten. Finally, and optionally, the etch stop layer can be either retained in place or removed, and the tungsten layer is chemically and mechanically polished using known CMP processes back to a depth substantially coplanar with the surface of the etch stop layer when the etch stop layer is retained in place. Optionally, surface contact pads may be formed on top of the completed metal pattern. Also optionally, the etch stop layer removal step can be carried out prior to the tungsten deposition step, and blanket etching of metal can be used instead of CMP processes.

Accordingly, it is an object of the present invention to provide a new and improved self-aligning process for making electrical contacts in the manufacture of high density integrated circuits.

Another object of this invention is to provide a new and improved process of the type described which represents a novel alternative with respect to the above described Dual Damascene process.

Another object of this invention is to provide a new and improved process of the type described which operates to increase maximum achievable device packing density in the manufacture of integrated circuits.

Another object of this invention is to provide a new and improved electrical contact forming process of the type described which enhances device reliability and device yields.

Another object of this invention is to provide a new and improved process of the type described which may be repeated through a plurality of stacked dielectric layers such as $SiO_2$ to thereby form a multi-level metal integrated circuit.

Briefly summarized, and commensurate in scope with the broad claims filed herein, the present process of forming electrical contacts in the manufacture of integrated circuits includes the steps of: forming an insulating layer on the surface of a silicon substrate; forming an etch stop layer on the surface of the insulating layer; forming an opening in the etch stop layer; etching through the opening to a first trough depth into the insulating layer exposed by the opening in the etch stop layer; forming a photoresist etch mask on the surface of the etch stop layer and in a portion of the trough; continuing to etch the exposed portion of the insulating layer until reaching the surface of the silicon substrate to thereby form the contact or stud hole; removing the photoresist mask; and filling the trough and hole thus formed with a selected metal such as tungsten. In a preferred embodiment of the invention, chemical-mechanical polishing processes are used to remove a portion of the selected metal back to a depth coplanar with the surface of the etch stop layer or surface of the insulating layer.

The above brief summary of the invention, together with its attendant objects, advantages and novel features will become better understood with reference to the following description of the accompanying drawings.

DETAILED DESCRIPTION OF THE PREFERRED EMBODIMENTS

Figure 1:
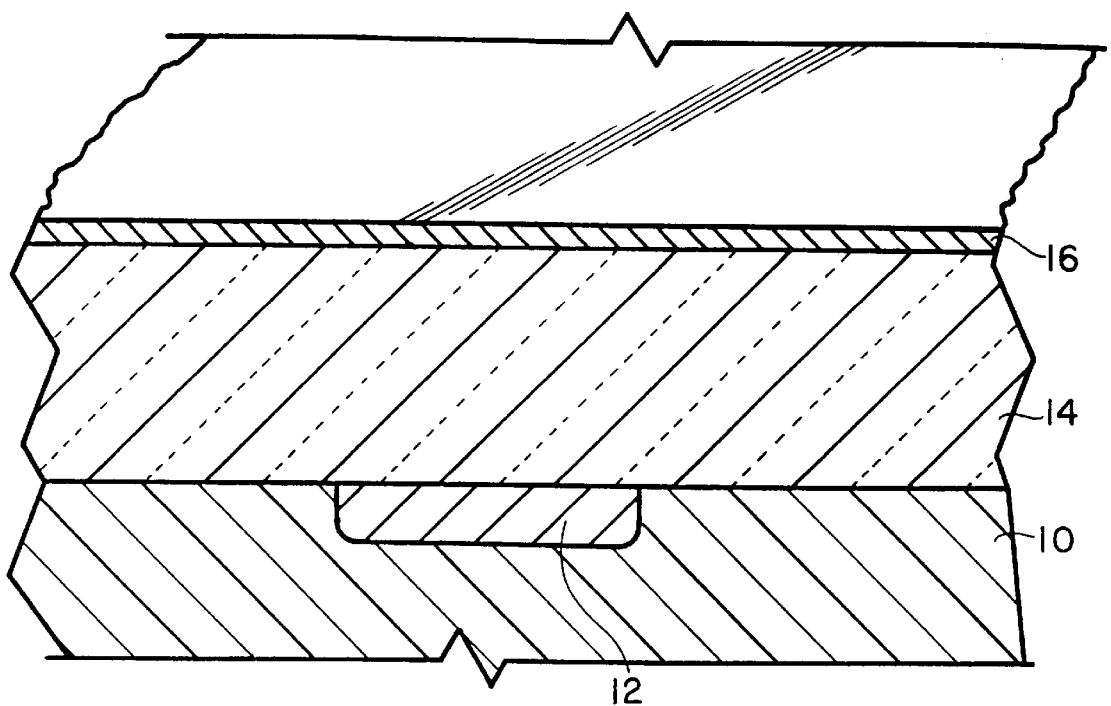
FIGS. 1 through 10 are a series of schematic cross section diagrams illustrating the sequence of process steps used in a preferred process embodiment of the invention.

Referring now to FIG. 1, there is shown a silicon substrate 10 in which one or more active device regions 12 have been formed using conventional diffusion or ion implantation doping techniques together with conventional photolithographic masking and etching procedures. Typically, a relatively insulating layer 14, preferably made of silicon dioxide, will be formed on the surface of the silicon substrate 10 using low temperature chemical vapor deposition processes and preferably a known tetraethylorthosilicate (TEOS) process. Next, a thin etch stop layer 16 is formed to a thickness of about 500–1000 angstroms on the surface of the insulating layer 14. Etch stop layer 16 may be made of any suitable material such as silicon nitride, $Si_3N_4$, or titanium oxide, TiO, or aluminum oxide, $Al_2O_3$.

Figure 2:
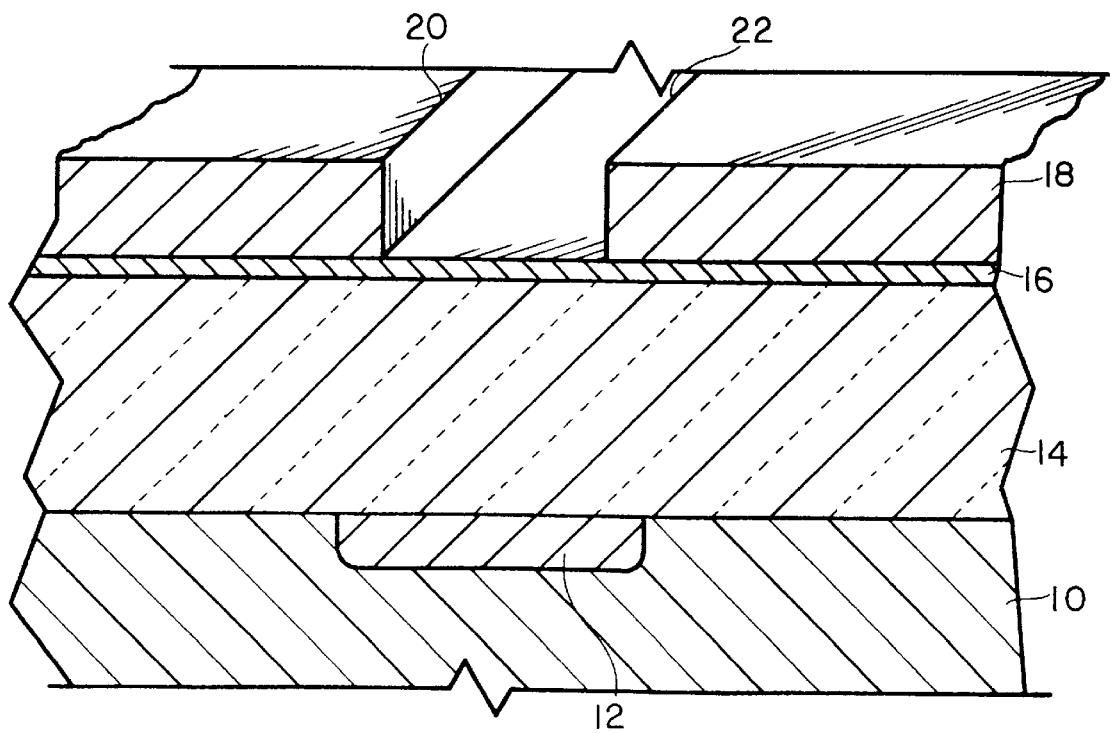
Figure 3:
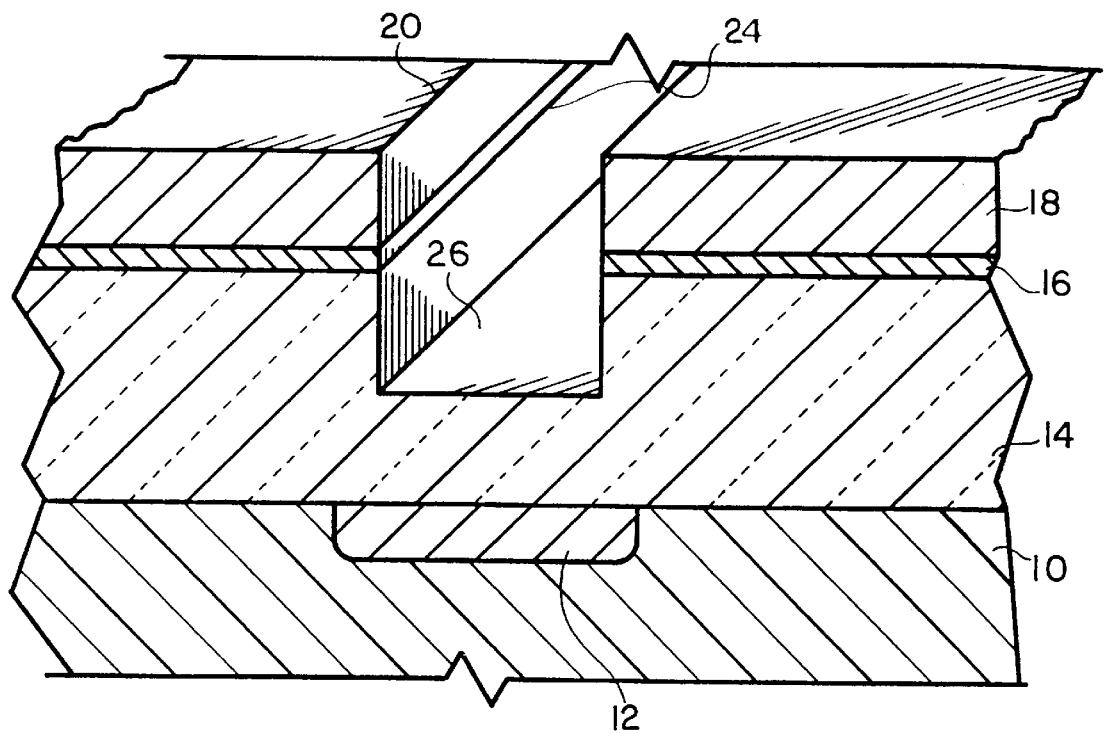
Figure 4:
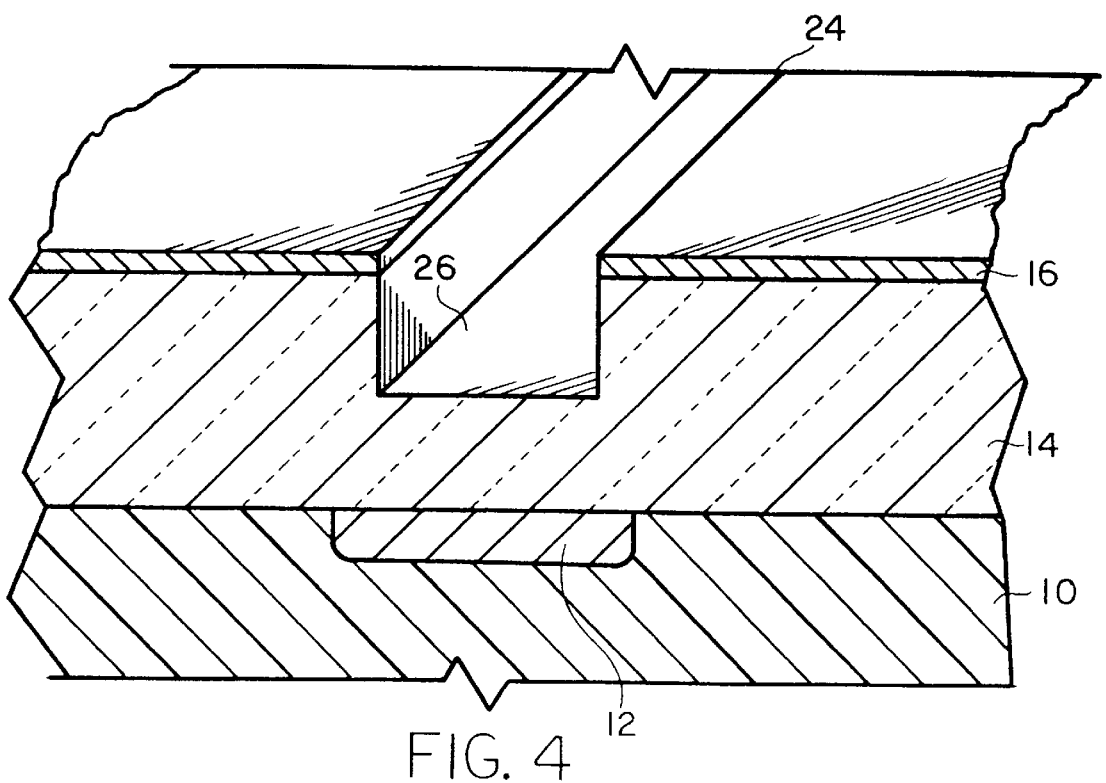

An opening is then formed in etch stop layer 16 to expose portions of insulating layer 14 at locations of desired trough patterns. In the preferred embodiment, and referring now to FIG. 2, a first photoresist mask 18 is formed on the surface of the etch stop layer 16, and an opening 20 is formed in the photoresist mask 18 using conventional photolithographic masking and etching procedures in order to expose a given area 22 of the etch stop layer 16. Then, as shown in FIG. 3, an opening is first etched as indicated at 24 in the etch stop layer 16 using an etchant such as $CHF_3$ and $CF_4$, and the first photoresist mask 18 in FIG. 3 may be left in place during etching down to a first desired trough depth 26 within the insulating layer 14. Once the trough depth 26 has been reached, then the photoresist mask 18 in FIG. 3 is removed as shown in FIG. 4. The etch stop layer 16 of either silicon nitride, titanium oxide, aluminum oxide or other equivalent dense inorganic insulating material will be quite suitable to serve as an etch mask during the etching of the insulating layer 14 in the geometry shown in FIGS. 3 and 4.

Figure 5:
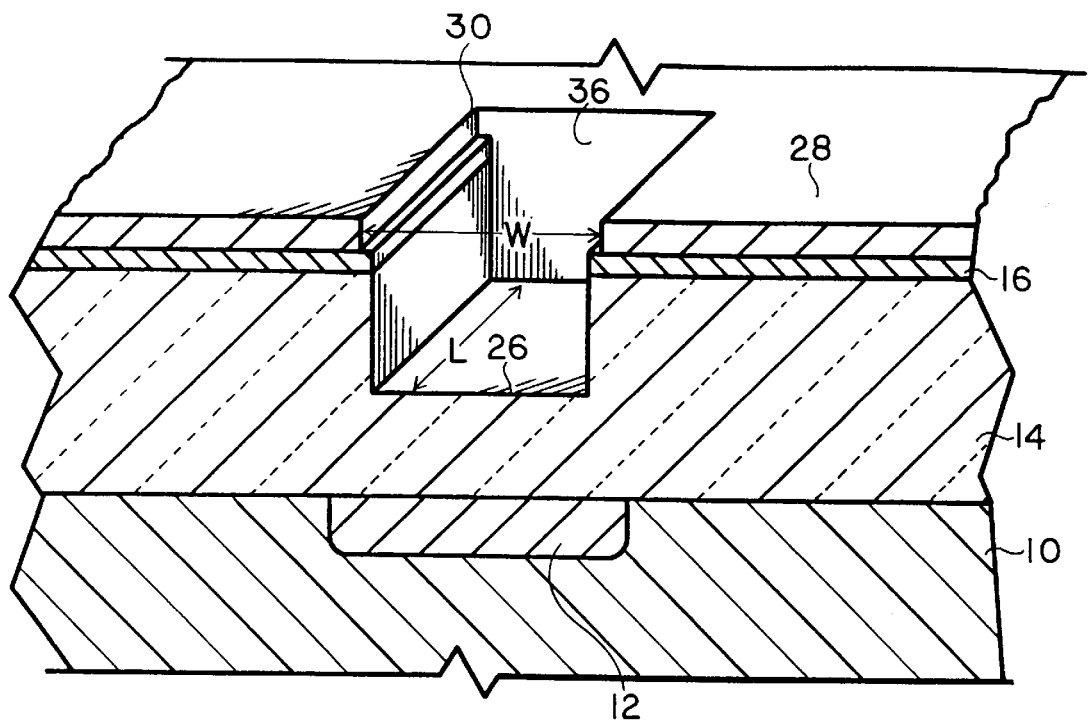
Figure 6:
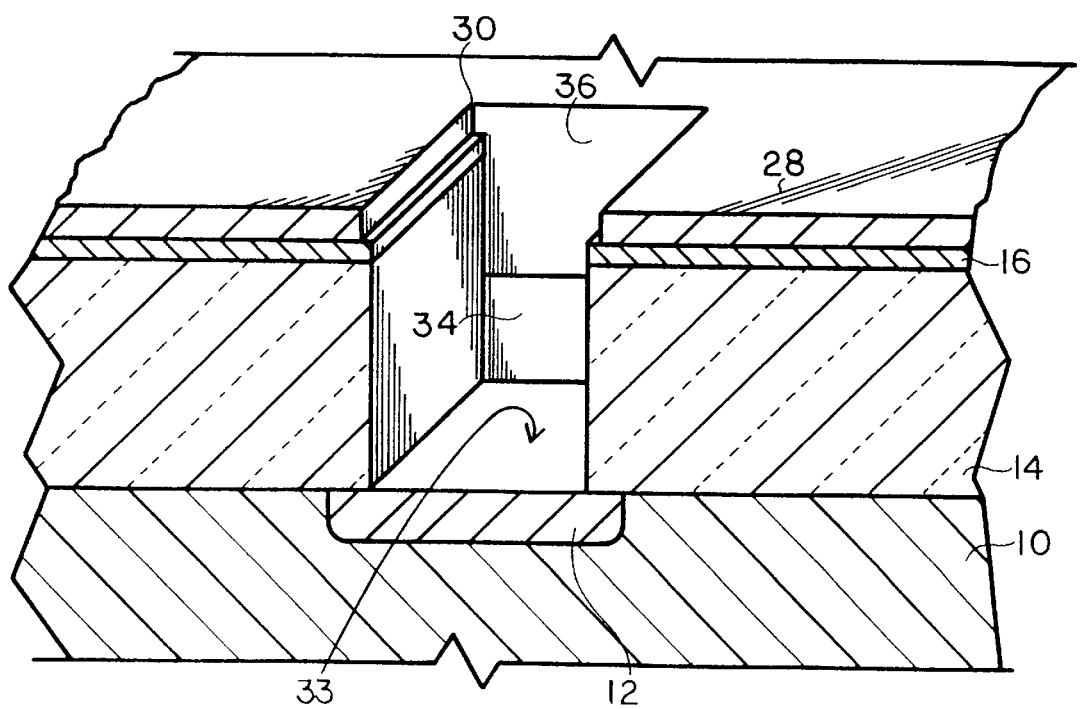

Referring now to FIG. 5, a second photoresist mask 28 having an opening 30 therein is formed on the surface of the etch stop layer 16. This second photoresist mask 28 will serve to mask against etching carried out using state of the art reactive ion etching (RIE techniques). Opening 30 in photoresist mask 28 has a width dimension, W, and need not be precisely aligned with the corresponding width dimension of the trough opening 26 because, during this etching process, etch stop layer 16 will serve to mask against the vertical ion bombardment except in the region of the trough 26. Such ion bombardment and etching will continue etching through the $SiO_2$ insulating layer 14 until reaching the active device region 12 to thereby produce the contact hole 33 indicated in FIG. 6. As seen in FIG. 6, the length dimension L, of the contact hole 33 extends to a back wall 34 of the insulating layer 14, and this back wall 34 is aligned with the back wall 36 of the second photoresist mask 28.

Figure 7:
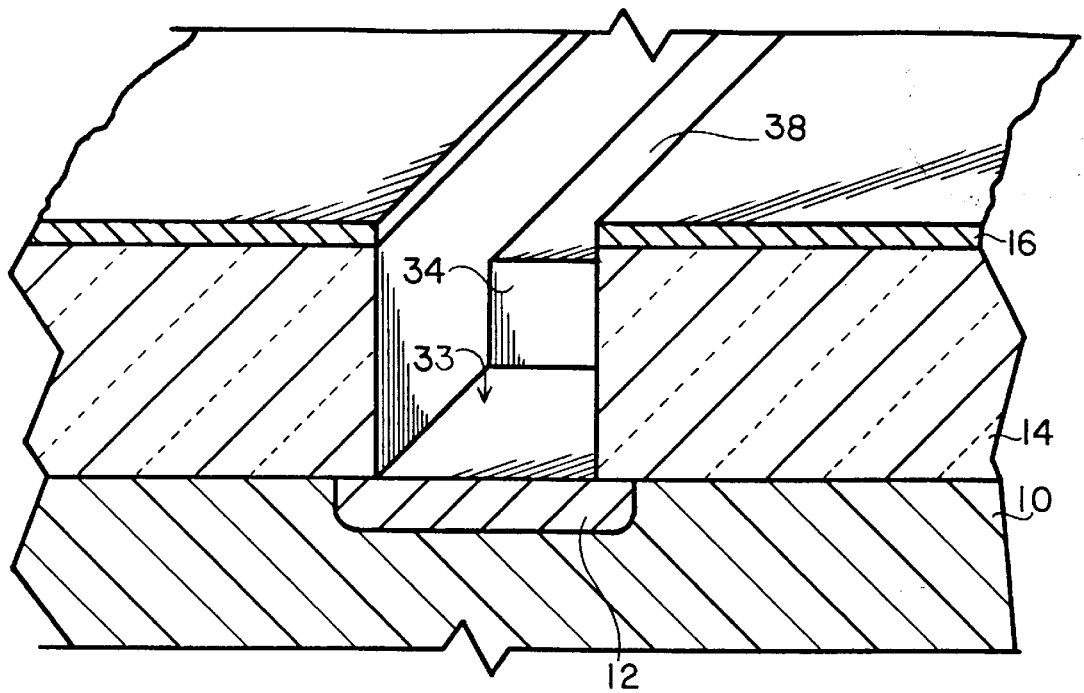

Referring now to FIG. 7, the second photoresist mask 28 in FIG. 6 has been removed to show the completed trough and hole geometry consisting of a first depth at the trough 38 which extends into the device structure of FIG. 7 and the second greater depth of control hole 33. There is no criticality of mask alignment of the width dimension W of the photoresist mask 28 with the width dimension of the vertical trough being etched. However, the alignment of the contact hole 33 length dimension, L, as defined by the back wall 36 of the photoresist mask 28 in FIG. 6 still remains critical to defining the precisely desired device geometries for the integrated circuits being manufactured.

Figure 8:
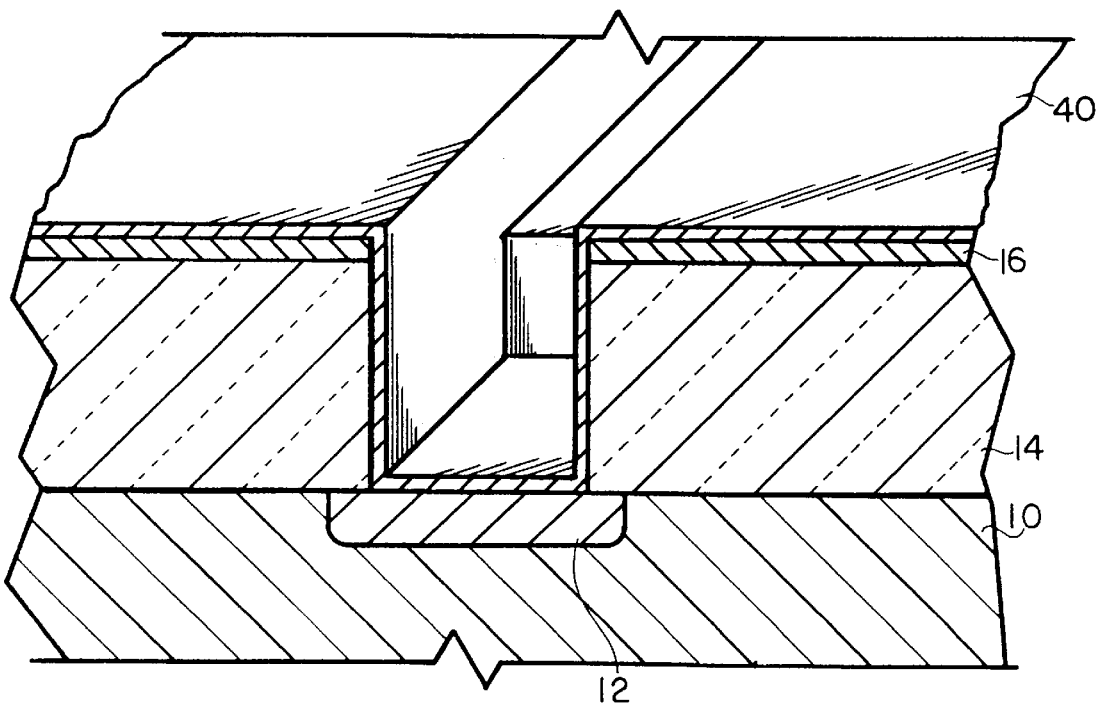
Figure 9:
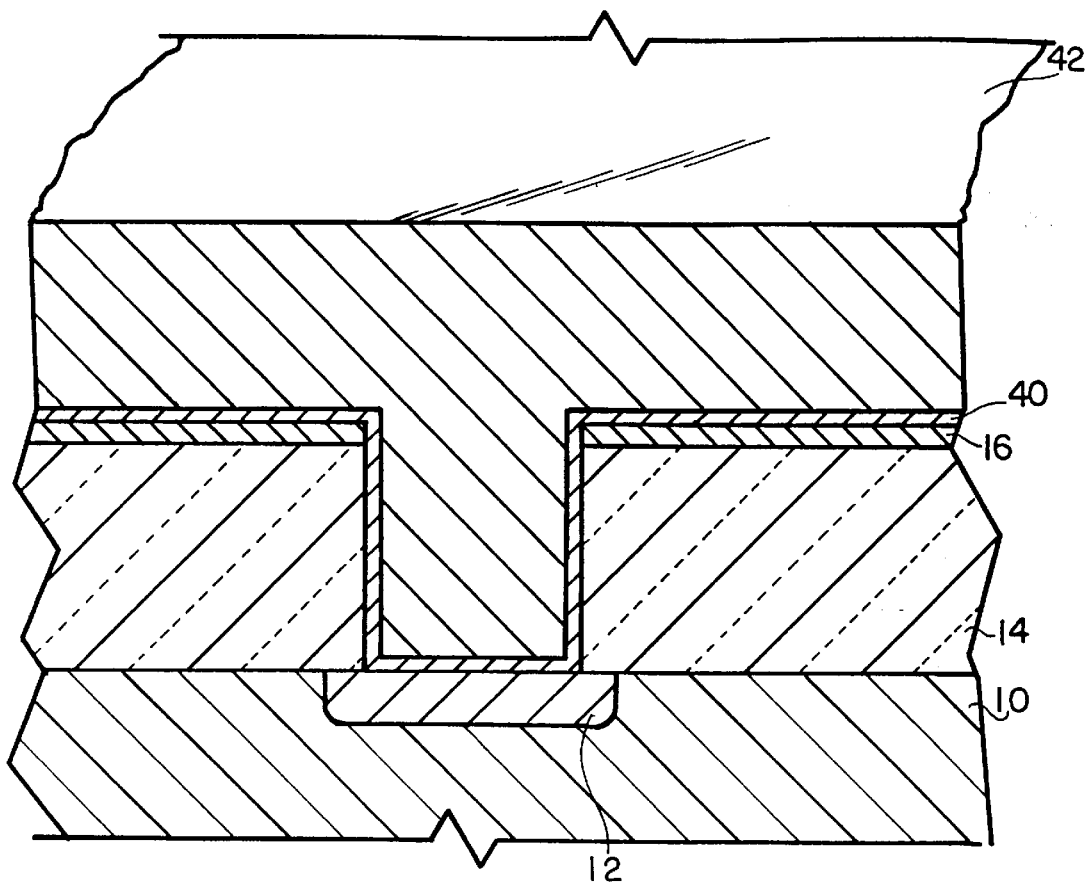
Figure 10:
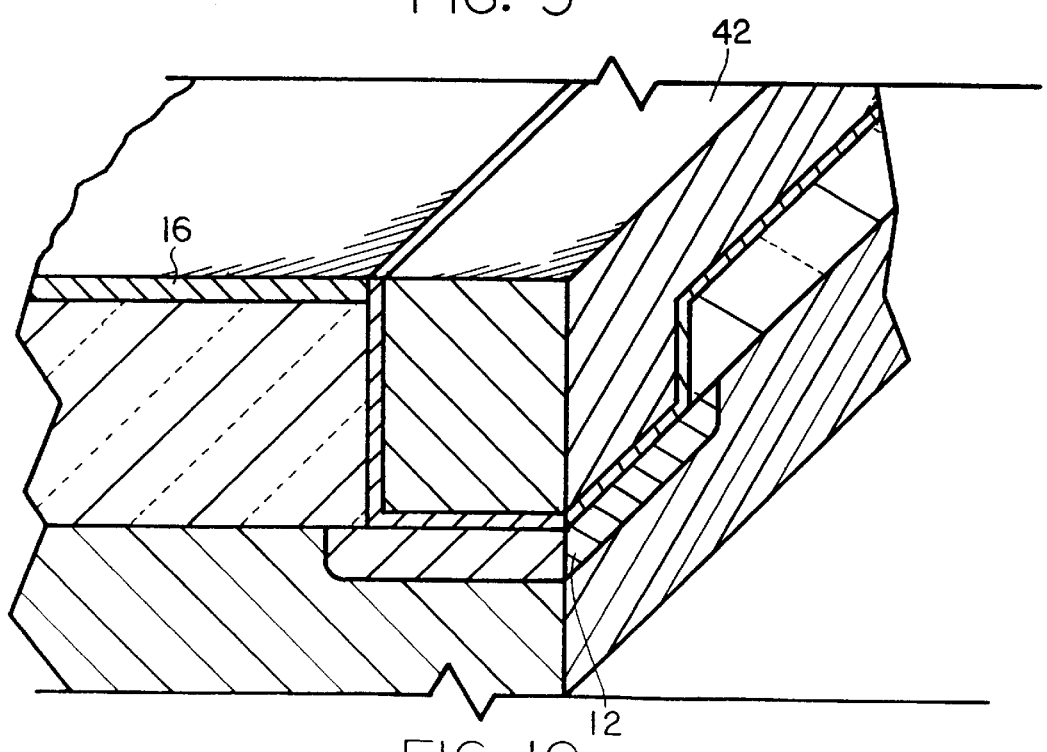

Referring now to FIG. 8, the exposed surfaces of trough 38 and contact hole 33 and the top surfaces of the etch stop layer 16 are covered with adhesion layer 40, and then as shown in FIG. 9, a metal layer 42 is deposited on the outer surface of the adhesion layer 40. This metal layer 42 will preferably be either tungsten, copper or silver which is laid down using conventional metal deposition processes. Adhesion layer 40, preferably made of titanium nitride, is sputter deposited on insulating layer 14 and etch stop layer 16 to improve bonding with metal layer 42. Frequently, it will be desired to then polish or etch back metal layer 42 so that the ultimate top surface of the selected metal layer 42 is coplanar with the top surface of the etch stop layer 16 as shown in FIG. 10.

Optionally, the etch stop layer 16 can be used as a mask during etching of the metal layer 42 so that the metal layer 42 can be etched through opening 24 in etch stop layer 16 down to and coplanar with the top surface of insulating layer 14. Etch stop layer 16 would then be removed. The etch stop layer 16 may also be removed prior to forming the adhesion and metal layers 40 and 42, respectively. Also optionally, surface contact pads or interconnects (not shown) may be made on top of or leading into the planarized metallization-filled troughs described above.

Various modifications may be made in and to the above described embodiment without departing from the spirit and scope of this invention. For example, the present invention is in no way limited by the particular materials or layer thicknesses described above which are only exemplary of certain typical materials and layer thicknesses used in existing ULSI semiconductor fabrication processes. In addition, the etch stop layer may be either removed or retained in place after the vertical trough forming process has been completed. Furthermore, the present invention is not limited to the electrical interconnection through a single layer of dielectric material, e.g. $SiO_2$, as shown in FIG. 10 and may instead be used in various types of multi-level metallization processes such as those shown, for example, in copending application Ser. No. 07/775,744, U.S. Pat. No. 5,204,286 of Trung T. Doan entitled "Method of Making Self-Aligned Contacts and Vertical Interconnects to Integrated Circuits and Devices Made Thereby," filed Oct. 15, 1991, assigned to the present assignee and incorporated herein by reference. Accordingly, these and other process and device modifications are clearly within the scope of the following appended claims.

We claim:

1. A process for forming electrical contacts for integrated circuits, comprising the steps of:
   a. forming a first layer on a substrate;
   b. forming an etch stop layer consisting of an inorganic compound on the first layer, the etch stop layer being selectively etchable with respect to the first layer;
   c. forming an opening in the etch stop layer at a desired location of a trough;

d. etching the first layer through the opening to a first depth to form a trough;

e. forming a mask over the trough and the etch stop layer;

f. selectively removing the mask to expose portions of the first layer within the trough at a desired location of a contact hole;

g. etching the exposed portions of the first layer to a second depth to form a contact hole; and h. removing the mask.

2. A process according to claim 1, wherein the first layer comprises electrically insulating material.

3. A process according to claim 1, wherein the inorganic compound is selected from the group consisting of silicon nitride, titanium, oxide and aluminum oxide.

4. A process according to claim 1, further comprising the step of forming an adhesion layer on the surfaces of each hole and trough.

5. A process according to claim 4, further comprising the step of filling each hole and trough at least partially with electrically conductive material after the adhesion later has been formed.

6. A process according to claim 1, further comprising the step of filling each hole and trough at least partially with electrically conductive material.

7. A process according to claim 6, further comprising the step of making an upper surface of the conductive material coplanar with an upper surface of the etch stop layer.

8. A process according to claim 6, further comprising the step of removing the etch stop layer.

9. A process according to claim 8, further comprising the step of making an upper surface of the conductive material coplanar with an upper surface of the first layer.

10. A process according to claim 1, wherein the process steps are repeated through a plurality of first layers to form multi-level metal vias in a multi-level integrated circuit.

11. A process for forming electrical contacts for integrated circuits, comprising the steps of:

a. forming a first layer of etchable material;

b. forming an etch stop layer consisting of an inorganic compound having an opening therein on the first layer, wherein the opening defines a width dimension of a trough and a contact hole;

c. etching the first layer through the opening to a first depth to form a trough;

d. forming a mask over the trough and the etch stop layer;

e. selectively removing the mask to expose a portion of the first layer at a desired location of a contact hole; and f. etching the exposed portion of the first layer to a second depth to form a contact hole.

12. A process according to claim 11, wherein step (e) further comprises exposing a portion of the etch stop layer adjacent the opening.

13. A process according to claim 11, further comprising the steps of:

a. forming an etch stop mask over the etch stop layer;

b. selectively removing the etch stop mask to expose portions of the etch stop layer at a desired location of a trough; and c. etching the exposed portions of the etch stop layer to form the opening therein.

14. A process for forming electrical contacts for integrated circuits, comprising the steps of:

a. forming a first layer on a substrate;

b. forming an etch stop layer on the first layer, the etch stop layer being selectively etchable with respect to the first layer; c. forming an opening in the etch stop layer at a desired location of a trough using a first mask;

d. etching the first layer through the opening to a first depth to form a trough;

e. forming a second mask over the trough and the etch stop layer after removing the first mask;

f. selectively removing the second mask to expose portions of the first layer within the trough at a desired location of a contact hole;

g. etching the exposed portions of the first layer to a second depth to form a contact hole, and h. removing the second mask.

15. A process according to claim 14, wherein the step of selectively removing the second mask comprises exposing a portion of the etch stop layer-adjacent the opening.

16. A process according to claim 14, wherein the first layer comprises electrically insulating material.

17. A process according to claim 14, wherein the etch stop layer comprises an inorganic compound selected from the group consisting of silicon nitride, titanium oxide and aluminum oxide.

18. A process according to claim 14, further comprising the step of forming an adhesion layer on the surface of each hole and trough.

19. A process according to claim 18 further comprising the step of filling each hole and trough at least partially with electrically conductive material after,the adhesion layer has been formed.

20. A process according to claim 14, further comprising the step of filling each hole and trough at least partially with electrically conductive material.

21. A process according to claim 20, further comprising the step of making an upper surface of the conductive material coplanar with an upper surface of the etch stop layer.

22. A process according to claim 20, further comprising the step of removing the etch stop layer.

23. A process according to claim 22, further comprising the step of making upper surface of the conductive material coplanar with an upper surface of the first layer.

24. A process according to claim 14, wherein the process steps are repeated through a plurality of first layers to form multi-level vias in a multi-level integrated circuit.

* * * * *